United States Patent [19]

Fujimori et al.

[11] Patent Number: 4,866,032
[45] Date of Patent: Sep. 12, 1989

[54] METHOD AND APPARATUS FOR PRODUCING THIN FILM OF HIGH Tc SUPERCONDUCTOR COMPOUND HAVING LARGE AREA

[75] Inventors: Naoji Fujimori; Keizo Harada; Shuji Yazu; Tetsuji Jodai, all of Itami, Japan

[73] Assignee: Sumimoto Electric Industries, Ltd., Osaka, Japan

[21] Appl. No.: 192,903

[22] Filed: May 12, 1988

[30] Foreign Application Priority Data

May 12, 1987 [JP] Japan .................................. 62-115340
May 9, 1988 [JP] Japan .................................. 63-112101

[51] Int. Cl.$^4$ ........................ H01L 39/24; C23C 14/34
[52] U.S. Cl. .................................. 505/1; 204/192.11;
204/192.12; 204/192.24; 204/298; 505/816
[58] Field of Search ........... 204/192.1, 192.11, 192.12,
204/192.24, 298 BD, 298 TT, 298 MM, 298
CX, 298 SM, 298 MD, 298 MR, 298 MD;
505/816

[56] References Cited

U.S. PATENT DOCUMENTS 4,046,666  9/1977  McClanahan et al. ............. 204/298
4,434,037  2/1984  Crank .............................. 204/192.12

Primary Examiner—Aaron Weisstuch
Attorney, Agent, or Firm—Wegner & Bretschneider

[57] ABSTRACT

A thin film of a preselected compound having a large area is continuously produced on a substrate by depositing elements constituting the preselected compound from a target member onto the surface of a substrate by sputtering, comprising the steps of:

rotating a first target member having a flat surface disposed around an axis which crosses the surface and comprising elements of the preselected compound so that a first part of the surface of target member is positioned at a first sputtering position and another part of the first target member is positioned at a second sputtering position, at the first position, sputtering at least one second target comprising at least one element of the preselected compound which is easily sputtered from the first target member so as to supply the deficient element to the first target member, and at the second position, sputtering the elements from the first target member so as to deposit them on the surface of said substrate while continuously supplying the substrate so that a part of the substrate is positioned in the path of the sputtered elements, whereby the elementary composition of the first target member at the second position is adjusted to the preselected composition.

12 Claims, 2 Drawing Sheets

METHOD AND APPARATUS FOR PRODUCING THIN FILM OF HIGH Tc SUPERCONDUCTOR COMPOUND HAVING LARGE AREA

BACKGROUND OF THE INVENTION

1. Field of the Invention

The present invention relates to a method and an apparatus for producing a thin film of a compound having a large area. More particularly, it relates to a method for producing a thin film of a compound on an elongate substrate or a large substrate by sputtering the compound on a continuously supplied substrate to form a thin film of the compound on the substrate, and an apparatus for carrying out said method.

2. Description of the Related Art

The superconductive phenomenon is said to be a phase transition of electrons and is a phenomenon in which a conductor has zero electric resistance and exhibits complete diamagnetism under specific conditions.

In electronic engineering, which is one of the technical fields in which the superconductive phenomenon can be utilized, various superconductive devices have been and are presently being proposed and developed. One of the typical devices is an element utilizing the Josephson effect in which the quantum effect is macroscopically exhibited by applied current. Since the superconductor has a small energy gap, a tunnel junction type Josephson element comprising the superconductor is expected to function as a high speed switching element with small power consumption. Further, since the Josephson effect appears as an exact quantum phenomenon against an electromagnetic wave or magnetic field, a Josephson element will be used as a highly sensitive sensor for sensing magnetic fields, microwaves, radiation, etc.

Since, in a very high speed computer, power consumption per unit area almost reaches the limit of cooling capacity, it is highly desired to provide superconductive elements. In addition, as the degree of integration in an electric circuit is increased, use of a superconductor as a wiring material is expected with little or no current loss.

In spite of enormous efforts, superconductor critical temperatures (Tc) did not exceed the 23K of $Nb_3Ge$ for a long time.

In recent years, a sintered material of an oxide such as $(La,Ba)_2CuO_4$ or $(La,Sr)_2CuO_4$ was found to be a superconductor with high Tc and is expected to realize high temperature superconductivity. In such oxide superconductors, a Tc of 30 to 50K and even 70K or higher is observed.

In addition, a composite oxide of the formula: $Y_1Ba_2Cu_3O_{7-w}$, which is referred to as "YBCO", is reported to be a 90K superconductor. Further, Bi-Sr-Ca-Cu type and Tl-Ba-Ca-Cu type composite oxides not only have Tc higher than 100K, but also are chemically stable so that their superconductive properties are less deteriorated as time passes, as compared to the superconductive properties of YBCO, which may deteriorate as time passes.

Since the oxide superconductor is prepared as a sintered material, it is usually brittle and requires great care in handling. That is, the ceramic oxide superconductor is easily broken or cracked by mechanical stress. Particularly, the ceramic oxide superconductor in the form of a wire is very easily broken. Therefore, its practical use is severely limited.

Furthermore, it is very difficult to form a sintered superconductor from homogeneous polycrystal consisting of particles all having superconductive characteristics. Moreover, as a general property of superconductors, the superconductive state may be locally broken by fluctuations in the external magnetic field or cooling temperature. The ceramic oxide superconductor has smaller thermal conductivity and larger electrical resistance than the classical superconductors. Therefore, when the superconductive state is locally broken, such parts of the superconductor are locally heated by the electric current which flows through the superconductor. If the cooling medium contacts a locally heated part of a superconductor, it is explosively vaporized.

To prevent such explosive vaporization, the classical metal superconductor is processed in the form of a thin filament and a plural number of filaments are bundled together by a good conductive material such as copper, which acts as a thermal conductor and a by-pass of electric current in case of loss of the superconductive state. However, it is difficult to process the ceramic oxide superconductor in the form of a filament produced by sintering and having high Tc.

To produce the wire or filament form oxide superconductor, it is essential to continuously form a thin film of the superconductor. As a result of extensive study, the present inventors have found that a sputtering method in which the superconductive material is used as a target is most suitable for forming a practically applicable thin film of the oxide superconductor.

However, since the oxide superconductor comprises several elements having different vapor pressures, adsorption probabilities and reaction rates, the composition of the compound formed on the substrate differs from that of the target, or the elementary composition on the surface of the target varies during sputtering.

When the thin film is formed on an elongate substrate or a large substrate, it takes a long time to form the thin film on the whole surface of the substrate. Therefore, the composition of the target varies during sputtering, when the compound itself is used as the target.

SUMMARY OF THE INVENTION

One object of the present invention is to provide a method for continuously producing a thin film of a compound, particularly ceramic oxide superconductor, having a large area on a substrate.

Another object of the present invention is to provide a method for producing a thin film of a compound having a homogeneous composition on a substrate.

A further object of the present invention is to provide an apparatus for continuously producing a thin film of a compound, particularly a ceramic oxide superconductor, having a large area, on a substrate.

According to the first aspect of the present invention, there is provided a method for continuously producing a thin film of a preselected compound having a large area on a substrate by depositing the elements constituting the compound from a target member onto the surface of substrate by sputtering, comprising the steps of:
 rotating a target member having a flat surface around an axis which crosses the surface and comprising elements of the preselected compound so that a part of the surface of the rotating target member is positioned at a first sputtering position and another part of the target member is positioned at a second sputtering position, at the first position, sputtering at least one further target comprising at least one element of the preselected compound which is easily sputtered from the rotating target member sop as to supply the deficient element to the rotating target member, and at the second position, sputtering the elements from the rotating target member so as to deposit them on the surface of said substrate while continuously supplying the substrate so that a part of the substrate is positioned in the path of the sputtered elements, whereby the elementary composition of the rotating target member at the second position is adjusted to the preselected composition.

According to the second aspect of the present invention, there is provided an apparatus for continuously producing a thin film of a preselected compound having a large area on a substrate, comprising:

a chamber, the internal pressure of which is reduced to high vacuum, means for supplying a selected gas atmosphere into the chamber, first sputtering means for supplying at least one element of the preselected compound to a moving target member having a flat surface disposed about an axis of motion which crosses said surface and comprising elements of the preselected compound, and second sputtering means for depositing elements of the preselected compound from the moving target member onto the surface of substrate in the chamber, wherein the target member moves between a first position at which the first sputtering is carried out and a second position at which the second sputtering is carried out.

DETAILED DESCRIPTION

Figure 1:
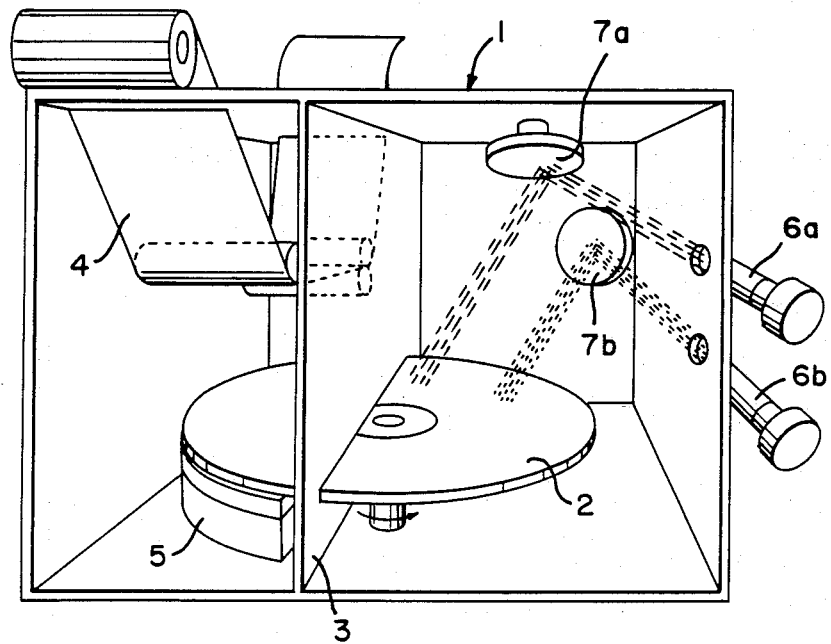
FIG. 1 schematically shows an apparatus to be used for forming a thin layer of an oxide superconductor on a substrate according to the present invention, FIG. 2 schematically shows a right side subchamber of the chamber in which magnetron sputtering is used for supplying a deficient element, and FIG. 3 schematically shows a right side subchamber of the chamber in which a metal rod is heated in vacuum by a heater which surrounds the rod to supply a deficient element.

The method and apparatus of the present invention are suitable for producing a thin film of an oxide superconductor, particularly, an oxide superconductor having a composition of the formula:

$$(M^1_{1-x}M^2_x)M^3_yM^4_z \qquad (I)$$

wherein $M^1$ is at least one element selected from the IIa group elements, $M^2$ is at least one element selected from the IIIb group elements. $M^3$ is at least one element selected from Ib, IIb, IIIa, IVb and Vb group elements, $M^4$ is at least one element selected from the group consisting of oxygen, boron, carbon, nitrogen, fluorine, and sulfur, x is the atomic ratio of $M^2$ to $(M^1+M^2)$, having a value from 0.1 to 0.9 and y and z are the atomic ratios of $M^3$ and $M^4$ to $(M^1+M^2)$, having values from 1.0 to 4.0 and from 1 to 5, respectively.

Preferred examples of the IIa group element $M^1$ are Ba, Sr, Ca, Mg and Be, particularly Ba and Sr. It is preferred that 10 to 80% of the element $M^1$ comprises at least one of Mg, Ca, and Sr. Preferred examples of the IIb element $M^2$ are Y and lanthanoids (e.g. La, Sc, Ce, Gd, Ho, Er, Tm, Yb, and Lu), particularly Y, La, and Ho. It is preferred that 10 to 80% of the element $M^2$ comprises at least one of Sc and the lanthanoids. Generally, element $M^3$ is Cu, although a part of the element $M^3$ may be replaced with at least one element from the Ib, IIb, IIIa, IVb, and Vb group elements, preferably Ti and V.

Preferred examples of the oxide superconductor (I) are $Y_1Ba_2Cu_3O_{7-w}$, $La_1Ba_2Cu_3O_{7-w}$, $La_1Sr_2Cu_3O_{7-w}$, $Ho_1Ba_2Cu_3O_{7-w}$, $Nd_1Ba_2Cu_3O_{7-w}$, $Sm_1Ba_2Cu_3O_{7-w}$, $Eu_1Ba_2Cu_3O_{7-w}$, $Gd_1Ba_2Cu_3O_{7-w}$, $DY_1Ba_2Cu_3O_{7-w}$, $Er_1Ba_2Cu_3O_{7-w}$, and $Yb_1Ba_2Cu_3O_{7-w}$, wherein w is larger than 0 (zero) and smaller than 1 (one).

The method and apparatus of the present invention are also suitable for producing thin film of a superconductor comprising a mixed phase or a single phase of a composite oxide having a composition of the formula:

$$M^5_p(M^6_{1-q}, Ca_q)_mCu_nO_{r+s} \qquad (II)$$

wherein $M^5$ is Bi or Tl, $M^6$ is Sr when $M^5$ is Bi or Ba when $M^5$ is Tl, p is 4, m is from 6 to 10, n is from 4 to 8, r is $(3p+2m+2n)/2$, q is larger than 0 (zero) and smaller than 1 (one), and s is from $-2$ to 2.

Specific examples of the superconductor (II) are $Bi_4Sr_4Ca_4Cu_6O_{20+s}$, $Bi_2Sr_2Ca_2Cu_3O_{10+s}$, $Tl_4Ba_4Ca_4Cu_6O_{20+s}$, and $Tl_2Ba_2Ca_2Cu_3O_{10+s}$.

As the substrate on which the thin film of the compound is formed, any metallic substrate can be used. The substrate can be formed by a non-metallic base material coated with a layer of metal. Examples of metallic substrates are those made of stainless steel, Cu, Ag, Au, Pt, Pd, Rh, Fe, Pb, Sn, Cd, Ti, W, Mo, Zr, Hf, Ta, Nb, and alloys thereof. Among them, Cu and Fe are preferred since they are inexpensive and easily processed. Pt is also preferred since it is stable and chemically inactive against the oxide superconductor. Further, Ag, Pd, and Rh are advantageous as a substrate material particularly for the oxide superconductor, which requires control of an oxygen content, since some kinds of their oxides liberate oxygen by temperature change. Preferably, the surface of a substrate made of these materials is coated with $ZrO_2$ or MgO. This is because the critical current density of the oxide superconductor has crystal anisotropy. When the oxide superconductor is formed on the layer of $Zr_2O$ or MgO, its crystal orientation is in the direction of the c axis so that a critical current density can be increased and the current direction in which the critical current density is large can be controlled.

To supply the deficient element to the target member at the first position, any of the physical deposition methods can be used. Particularly, ion beam sputtering is preferred.

The second sputtering of the compound onto the substrate can be carried out by an of the conventional sputtering methods. Among them, magnetron sputtering is preferred.

The substrate may be heated at a temperature of 230° to 1410° C., preferably 500° to 1,000° C. The formed thin layer of the oxide superconductor may be postheated in an oxygen-containing atmosphere at a temperature of 230° to 1410° C., preferably 500° to 1,000° C. and annealed by cooling at a cooling rate of 10° C./min.

or less. By annealing, oxygen defects in the oxide superconductor crystal are removed so that the superconductive properties are improved.

In the apparatus of the present invention, the easily sputtered element is supplied to a part of the target member at the first sputtering position and then said part of the target member is circulated to the second sputtering position at which all the elements are sputtered to deposit them on the surface of the substrate. Then, said part is returned to the first position and the element is again supplied thereto. Therefore, each part of the target member which is moved to the second position contains all the elements in a desired ratio, and the thin film of the compound with a homogeneous composition can be formed continuously on the elongate or large substrate.

The target member is preferably in the form of a cylinder or a disc and is rotated between the first and second sputtering positions. When the first and second sputtering positions require different sputtering conditions, such as atmosphere, the chamber of the apparatus is partitioned by a wall into two subchambers, and the target member is circulated between the two subchambers, with the desired atmosphere of each subchamber being maintained by differential exhausting.

In the present invention, the substrate is preferably of linear form such as a tape or a sheet and continuously supplied to the chamber of the sputtering apparatus.

According to the present invention, the composition of the target member can be kept constant for a long time, and it is possible to form the homogeneous thin layer of the compound on a whole length of a continuously supplied elongate substrate.

One of the particularly advantageous applications of the present invention is production of a linear form oxide superconductor.

PREFERRED EMBODIMENTS OF THE INVENTION

Preferred embodiments of the present invention will be illustrated by way of example by making reference to the accompanying drawings.

EXAMPLE 1

By the method of the present invention, a thin film of an oxide superconductor having a composition of $Ba_2YCu_3O_y$ was formed on an elongated tape made of stainless steel.

The apparatus used in this Example is schematically shown in FIG. 1.

The apparatus of FIG. 1 comprises a sputtering chamber 1, at a substantially center position of which a disc shaped target member 2 is installed. The target member consists of a sintered oxide material, the composition of which is adjusted by taking the formation of the thin film by RF sputtering into consideration.

A wall 3 divides the chamber 1 into two subchambers. In the left side subchamber, sputtering of the compound is carried out to form a thin film of the compound on a stainless steel tape 4. For this purpose, a magnet 5 is placed beneath the target member 2 to establish magnetron conditions. On a right side of the wall, a pair of ion beam sputtering apparatuses 6a and 6b and a pair of targets 7a and 7b are positioned to supply the deficient elements to the target member 2.

The target member 2 is rotated at a predetermined rate. In the left side subchamber, it is used as a source member for sputtering the desired compound onto the substrate, and then it is replenished with the deficient element(s) in the right side subchamber.

In the case of sputtering of a Ba-Y-Cu composite material, Y tends to remain in the target member, while Ba is most easily sputtered. Therefore, in this Example, Cu and Ba were supplied from the targets 7a and 7b, respectively.

If RF sputtering is effected in the right side subchamber, high frequency fills the whole chamber 1. Therefore, some measure should be taken to prevent the sputtering induced by such high frequency in the left side subchamber. To this end, ion beam sputtering under highly reduced pressure is preferred for supplying the deficient elements in the right side subchamber. The supplied amounts of the elements can be controlled by adjusting accelerating voltages of ion sources and gas pressure in the chamber 1. Preferably, pressures in the right and left side subchambers are adjusted independently from each other by installing an independent exhausting means to each subchamber. In the apparatus used in this Example, a rotary pump and an oil diffusion pump are connected to each subchamber, and the pressure is reduced to around $10^{-3}$ Torr by the rotary pump and then precisely controlled by the oil diffusion pump.

The parameters and conditions used in this Example were as follows:

(1) Target member (disc form)
Sintered material of $BaY_2CuO_7$
  Outer diameter: 15 inches
  Inner diameter: 7 inches
  Applied output power: 10 W/cm$_2$
  Rotation speed: 0.5 rpm
  Deposition rate: 10 Å/sec.

(2) Sputtering conditions on the substrate
  Magnetic field: 300 G on the substrate surface
  Substrate temperature: 700° C.
  Partial pressure of argon: $8 \times 10^{-3}$ Torr
  Partial pressure of oxygen: $2 \times 10^{-3}$ Torr (3) Sputtering conditions for supplying deficient elements
  Target 7a: Cu
  Target 7b: Ba
  Vacuum: $5 \times 10^{-4}$ Torr (argon)
  Accelerating voltage:
    Ion source 6a: 4 kV
    Ion source 6b: 5 kV The target disc member 2 may be produced as follows:

A mixture of powdery oxides, carbonates, nitrates, or sulfates of Ba, Y, and Cu in a predetermined weight ratio is molded in a suitable shape and then sintered at a high temperature according to a conventional method. Preferably after the molded mixture is presintered, it is ground, molded and again sintered.

Although in the above Example ion beam sputtering was used for supplying the deficient elements, other suitable methods can be used for supplying the deficient elements. Further, not only Ba and Cu but also Y can be supplied so as to more precisely control the growth rate of the thin film of the compound and/or the elementary composition of the compound.

Figure 2:
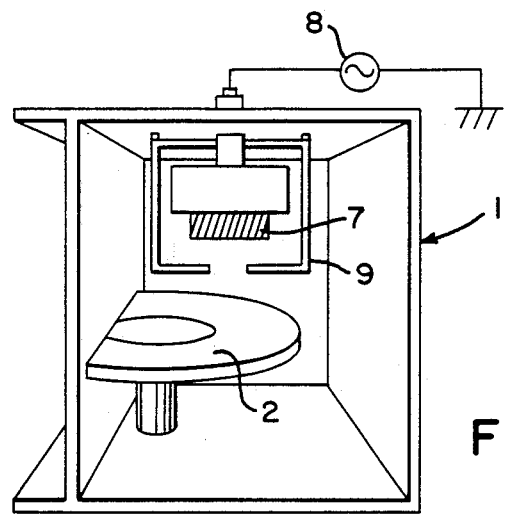

FIG. 2 schematically shows another embodiment of a right side subchamber of the chamber 1 in which magnetron sputtering is used for supplying a deficient element to the target member 2. A magnetron electrode 9 is installed over the target member 2 and connected to a high frequency source 8. In the electrode 9, the target 7 for supplying the deficient element is positioned.

Figure 3:
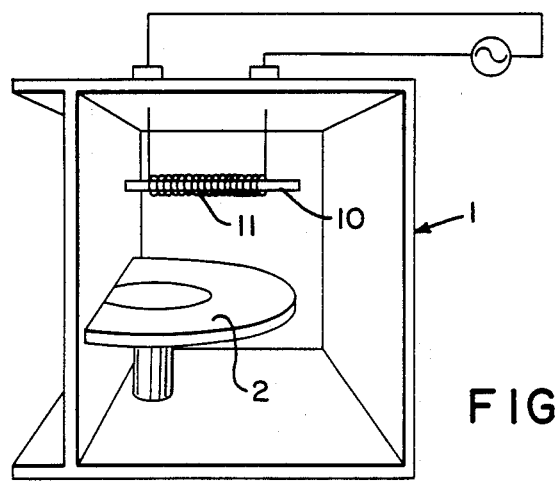

FIG. 3 schematically shows a further embodiment of a right side subchamber of the chamber 1 in which a metal rod 10 (for example, a copper rod) is heated in vacuum by a heater 11 which surrounds the rod 10 in order to evaporate the metal and deposit it on the target member 2 for supplying the deficient element (for example, copper).

EXAMPLE 2

By using the apparatus of FIG. 1, a thin layer of an oxide superconductor having a composition of $Bi_4Sr_4Ca_4Cu_6O_{20+s}$ was formed on an elongate tape made of stainless steel having a layer of $ZrO_2$ on the surface.

In the case of sputtering of a Bi-Sr-Ca-Cu composite material under the same conditions, Sr and Ca tend to remain in the target member, while Bi is most easily sputtered. Therefore, in this Example, Bi and Cu were supplied from the targets 7a and 7b, respectively.

The parameters and conditions used in this Example were as follows:

(1) Target member (disc form)
Sintered material of $Bi_4Sr_4Ca_4Cu_6O_{20+s}$
  Outer diameter: 15 inches
  Inner diameter: 7 inches
  Applied output power: 10 W/cm$^2$
  Rotation speed: 0.5 rpm
  Deposition rate: 10 Å/sec.
(2) Sputtering conditions on the substrate
  Magnetic field: 300 G on the substrate surface
  Substrate temperature: 700° C.
  Partial pressure of argon: $8 \times 10^{-3}$ Torr
  Partial pressure of oxygen: $2 \times 10^{-3}$ Torr
(3) Sputtering conditions for supplying deficient elements
  Target 7a: Bi
  Target 7b: Cu
  Vacuum: $5 \times 10^{-4}$ Torr (argon)
  Accelerating voltage:
    Ion source 6a: 4 kV
    Ion source 6b: 5 kV The disc shaped target member 2 was prepared by sintering a mixture of $Bi_2O_3$ powder, $SrCO_3$ powder, $CaCO_3$ powder and Cu powder in such ratio that the atomic ratio of Bi:Sr:Ca:Cu was 1:2:2:3, using conventional methods.

The present invention is not limited to the above illustrated embodiments.

When the thin film of the oxide superconductor is formed on a large area substrate, a shielding member can be employed. When a masking element is positioned over the substrate or a drum and the thin film of the oxide superconductor is formed through the mask, a coil for a superconductive magnet can be produced.

What is claimed is:

1. A method for continuously producing a film of a preselected compound having a large area on a substrate by depositing elements constituting the preselected compound from a target member onto the surface of said substrate by sputtering, comprising the steps of:

rotating a first target member having a flat surface disposed around an axis which crosses the surface and comprising elements of the preselected compound so that a first part of the surface of target member is positioned at a first sputtering position and another part of the first target member is positioned at a second sputtering position, at the position, sputtering at least one second target comprising at least one element of the preselected compound which is easily sputtered from the first target member so as to supply the deficient element to the first target member, and at the second position, sputtering the elements from the first target member so as to deposit them on the surface of said substrate while continuously supplying the substrate so that a part of the substrate is positioned in the path of the sputtered elements, whereby the elementary composition of the first target member at the second position is adjusted to the preselected composition.

2. The method according to claim 1, wherein the target member is in the form of a cylinder or disc and rotated around the axis of the cylinder or the center of the disc.

3. The method according to claim 1, wherein the compound to be sputter deposited is an oxide superconductor having a composition of the formula:

$$(M^1_{1-x}M^2_x)M^3_y M^4_z \qquad (I)$$

wherein $M^1$ is at least one element selected from the IIa group elements, $M^2$ is at least one element selected from the IIIb group elements, $M^3$ is at least one element selected from Ib, IIb, IIIa, and IVb and Vb group elements, $M^4$ is at least one element selected from the group consisting of oxygen, boron, carbon, nitrogen, fluorine, and sulfur, x is the atomic ratio of $M^2$ to $(M^1+M^2)$ and has a value from 0.1 to 0.9 and y and z are atomic ratios of $M^3$ and $M^4$ to $(M^1+M^2)$ and have values from 1.0 to 4.0 and from 1 to 5, respectively.

4. The method according to claim 1, wherein the substrate on which the thin film of the compound is formed is a metallic substrate made of a metal selected from the group consisting of stainless steel, Cu, Ag, Au, Pt, Pd, Rh, Fe, Pb, Sn, Cd, Ti, W, Mo, Zr, Hf, Ta, Nb, and alloys thereof.

5. The method according to claim 1, wherein the sputtering at the first position is ion beam sputtering.

6. The method according to claim 1, wherein the sputtering at the second position is magnetron sputtering.

7. The method according to claim 1, wherein the substrate is heated at a temperature of from 230° to 1,410° C. during sputtering.

8. The method according to claim 1, wherein the substrate is heated at a temperature of from 230° to 1,410° C. after forming the thin film of the preselected compound thereon.

9. An apparatus for continuously producing a thin film of a preselected compound having a large area on a substrate, comprising:

a chamber, the internal pressure of which is reduced to high vacuum, means for supplying a selected gas atmosphere to the chamber, first sputtering means for supplying at least one element of the preselected compound to a first target member having a flat surface disposed about an axis which crosses the surface and comprising elements of the preselected compound, and second sputtering means for depositing elements constituting the preselected compound from the first target member onto the surface of a substrate positioned in the chamber, wherein the target member moves between a first position at which the first sputtering is carried out and a second position at which the second sputtering is carried out.

10. The apparatus according to claim 9, wherein the target member is in the form of a cylinder or disc and is rotated around an axis of the cylinder or a center of the disc.

11. The apparatus according to claim 9, wherein the first sputtering means is an ion beam sputtering apparatus.

12. The apparatus according to claim 9, wherein the second sputtering means is a magnetron sputtering apparatus.

* * * * *